United States Patent [19]

Meyer

[11] Patent Number: 5,481,195
[45] Date of Patent: Jan. 2, 1996

[54] METHOD FOR FINDING A FAULT ON AN ELECTRICAL TRANSMISSION LINE

[75] Inventor: Stephan Meyer, Berlin, Germany

[73] Assignee: Siemens Aktiengesellschaft, Munich, Germany

[21] Appl. No.: 356,184

[22] Filed: Dec. 19, 1994

[30] Foreign Application Priority Data

Jun. 19, 1992 [DE] Germany .................... 42 20 410.0

[51] Int. Cl.$^6$ .................................................. G01R 31/11
[52] U.S. Cl. .................. 324/534; 324/76.33; 324/642; 324/533; 364/728.03
[58] Field of Search ........................... 324/534, 533, 324/76.33, 642, 647, 644; 364/728.03, 728.08

[56] References Cited

U.S. PATENT DOCUMENTS

| 3,991,364 | 11/1976 | Wiznerowicz | 324/533 |
| 4,041,381 | 8/1977 | Hwa . | |
| 5,083,086 | 1/1992 | Steiner | 324/533 |

FOREIGN PATENT DOCUMENTS

| 0062538 | 10/1982 | European Pat. Off. . |
| 2404223 | 8/1975 | Germany . |
| 3919497 | 12/1990 | Germany . |

OTHER PUBLICATIONS

Patent Abstracts of Japan, vol. 6, No. 166, 31 Aug. 1982 & JP-A-57 84 367 (Nippon Denshin Denwa Kosha) 26 May 1982.

Week 8186, 31 May 1980, Derwent Publications Ltd., London, GB & SU,A,738 121 (Gorbachev).

Week 7945, 15 Feb. 1979, Derwent Publications Ltd., London, GA; & SU,A,647,871 (Batutin).

Siemens Publication, Nov. 1969, pp. 80–81; M. Bindlingmaier et al.: *Einheiten, Grundbegriffe, Messverfahren der Nachrichten–Übertragungstechnik.*

*Primary Examiner*—Kenneth A. Wieder
*Assistant Examiner*—Jose M. Solis
*Attorney, Agent, or Firm*—Kenyon & Kenyon

[57] ABSTRACT

A method for finding a fault on an electrical telecommunications transmission line, applies a pulse to one end of the telecommunications transmission line and a reflected signal is detected at the same end. In order to be able to find accurately even faults which occur at long range, line pulse responses (J1, J2, J3) are determined and stored for different line lengths of a line of the same type. When a dirac pulse is applied to the telecommunications transmission line, the correlation coefficient ($r_{11}$, $r_{12}$, $r_{13}$) is in each case calculated from sections of the detected pulse response (JA) and from stored line pulse responses (I1, I2, I3), which in each case correspond to the sections in time. The reflection factor (R(t)) by multiplying the correlation factor ($r_{J1}$, $r_{J2}$, $r_{J3}$) by a computation variable ($Vxy_{J1}$) which is formed by the quotient of a value from the respective section of the pulse response (JA) and of the line pulse response (J1, J2, J3). The conductance (Gab(t)) of the fault is found from the reflection factor (R(t)), using the characteristic impedance (Z).

9 Claims, 3 Drawing Sheets

METHOD FOR FINDING A FAULT ON AN ELECTRICAL TRANSMISSION LINE

BACKGROUND OF THE INVENTION

The present invention relates generally to methods for finding faults on electrical transmission lines, and more particularly to a method for finding a fault on an electrical transmission line, in which a pulse is applied to one end of the transmission line and a reflected signal is detected at the same end.

Bindlingmaier, A. Haag and K. Kühnemann "Einheiten, Grundbegriffe, Messverfahren der Nachrichten-Übertragungstechnik" [Units, Fundamental Terminology, Measurement Methods for Telecommunications Transmission Technology], Siemens Akiiengesellschaft, Issue November 1969, pages 80 and 81, discloses a method for detecting a fault on an electrical transmission line, in which the time difference between a transmitted pulse and its echo signal is measured in order to deduce from this the position of a line fault. The significance and type of the fault can be found from the magnitude and form of the echo signal with respect to the corresponding parameters of the transmitted signal. However, the known method is suitable only for determining faults which are not located too far from the point at which the transmitted signal is fed in, but is not suitable for determining remotely located line faults, because the echo signal is lost in the noise in the case of faults located at long ranges. In addition, in the case of the known method, the profile, which is visible on the screen of an oscilloscope, of the transmitted signal and echo signal must be interpreted, with respect to faults, by a person skilled in the art.

U.S. Pat. No. 4,041,381 discloses a method for finding a fault on an electrical line in which a digital signal is repeatedly applied to the line to be investigated, which digital signal has the property that its autocorrelation function is a pulse function and the digital signals reflected on the line are received. In addition, in the case of the known method, further digital signals, which are similar to the first digital signals, are produced repeatedly and are progressively delayed. The delayed digital signals and the reflected signals are multiplied by one another, and the multiplication result is integrated. The range of the fault point giving rise to the reflection on the line is found from the peak value of the integration result.

DE 24 04 233 A1 discloses a method for the localization of fault points in the insulation of insulated conductors, in which method the autocorrelation function is found for a signal mixture arriving at one conductor end, but the signal mixture comprises interference-discharge and partial-discharge pulses. The partial-discharge pulses are produced at fault points in the insulation of the conductor when a sufficiently high AC voltage is applied and partial discharges occur there. The position of the fault points is deduced from the partial-discharge pulses detected at the conductor end. A precondition of this is that the partial-discharge pulses, which are scarcely raised above the level of the interference, can also actually be detected; the autocorrelation is used for this purpose.

The present invention is directed to the problem of developing a method for finding a fault on an electrical transmission line, which method considerably simplifies the detection and finding of faults as well as enabling the finding of faults occurring at a relatively long distance from the feed end.

SUMMARY OF THE INVENTION

The present invention solves this problem by: (1) determining and storing line pulse responses for different line lengths of a line of the same type as the transmission line; (2) applying a dirac pulse to the transmission line; (3) calculating the correlation coefficient from time sections of the detected pulse response of the transmission line as a reflected signal; (4) forming a computation variable in each case from sections, which correspond in time, of the stored line pulse responses of the line of the same type, which computation variable is a function of the quotient of a value from the respective section of the pulse response of the telecommunications transmission line and a value, which corresponds in time, of the line pulse responses of the line of the same type; (5) determining from the computation variable the reflection factor by multiplication by the respective correlation coefficient; (6) calculating the value of the resistance at the point of the fault using the reflection factor in accordance with the relationship $$R_{ab}(t) = \frac{1}{2} \times Z \times \left( \frac{1}{R(t)} + 1 \right) \quad (1)$$

in which Z designates the characteristic impedance of the telecommunications transmission line.

A major advantage of the method according to the invention is that it provides a measurement result which gives a statement on a fault, without any interpretation.

Another advantage is that it is not only possible to find line faults which are located close to that end of the transmission line to which the pulse is applied but also faults which are located at a relatively long range since, because of the correlation method used, such a fault can be found despite a reflected signal which is subject to relatively severe noise. Admittedly, in the context of the method according to the invention for finding a fault on an electrical transmission line, the line pulse responses of a line of the same type must be determined in advance by a dirac pulse in each case being applied to the line of the same type having artificially produced faults at a different line length, and the respective line pulse responses are detected and stored, but these preliminary tasks need be carried out only once in each case for one type of electrical transmission line to be investigated. The line pulse responses can instead, however, also be found by calculation, by taking into account parameters inherent to the line of the same type in this case. In the context of carrying out the method according to the invention, a model of line pulse responses of a line which is of the same type as the electrical transmission line which is in each case to be investigated is thus formed and, using this model, a line-oriented correlation is carried out which, over the measurement time period, continuously changes the pattern used for correlation.

In the case of the method according to the invention, the calculation of the correlation coefficient can be carried out in a different manner. Thus, it has been found to be advantageous to carry out the calculation of the correlation coefficient over a time duration which is composed of the rise time and the fall time of the line pulse response of the line of the same type. In order to carry out the calculation of the correlation coefficient taking into account as exactly as possible the situation where, for faults which occur at long range, the fall time of the line pulse response is a multiple of the rise time, the calculation of a partial correlation coefficient is carried out, in an advantageous manner, during the rise time of the line pulse response, and the calculation of a further partial correlation coefficient is carried out during the fall time of the line pulse response of the line of the same type, and the correlation coefficient is obtained by multiplication of the partial correlation coefficients. This avoids the rise time having less and less effect on the result during correlation with respect to the entire line pulse response.

In the case of the method according to the invention the correlation coefficients can be calculated for sections, which follow one another closely in each case, of the pulse response of the transmission line, which process, however, is linked with a very high detection and computation complexity.

In order to keep the computation complexity for carrying out the method according to the invention as low as possible, it is regarded as being advantageous if the pulse response of the transmission line is investigated for exceeding a predetermined threshold value and if a calculation of the value of the resistance at the point of the fault is carried out exclusively at times when the threshold is exceeded. A calculation of the correlation coefficients and the other variables mentioned above is then still carried out only at clearly defined points, as a result of which the measurement result can be obtained relatively quickly.

In the case of the method according to the invention, the calculation of the value of the resistance at the point of the fault can also be carried out at fixed times in the pulse response of the transmission line. These times are expediently selected to correspond to the times of recording the line pulse responses of the line of the same type. This type of method according to the invention is thus primarily suitable for monitoring a transmission line for faults at predetermined points.

DETAILED DESCRIPTION

Figure 1:
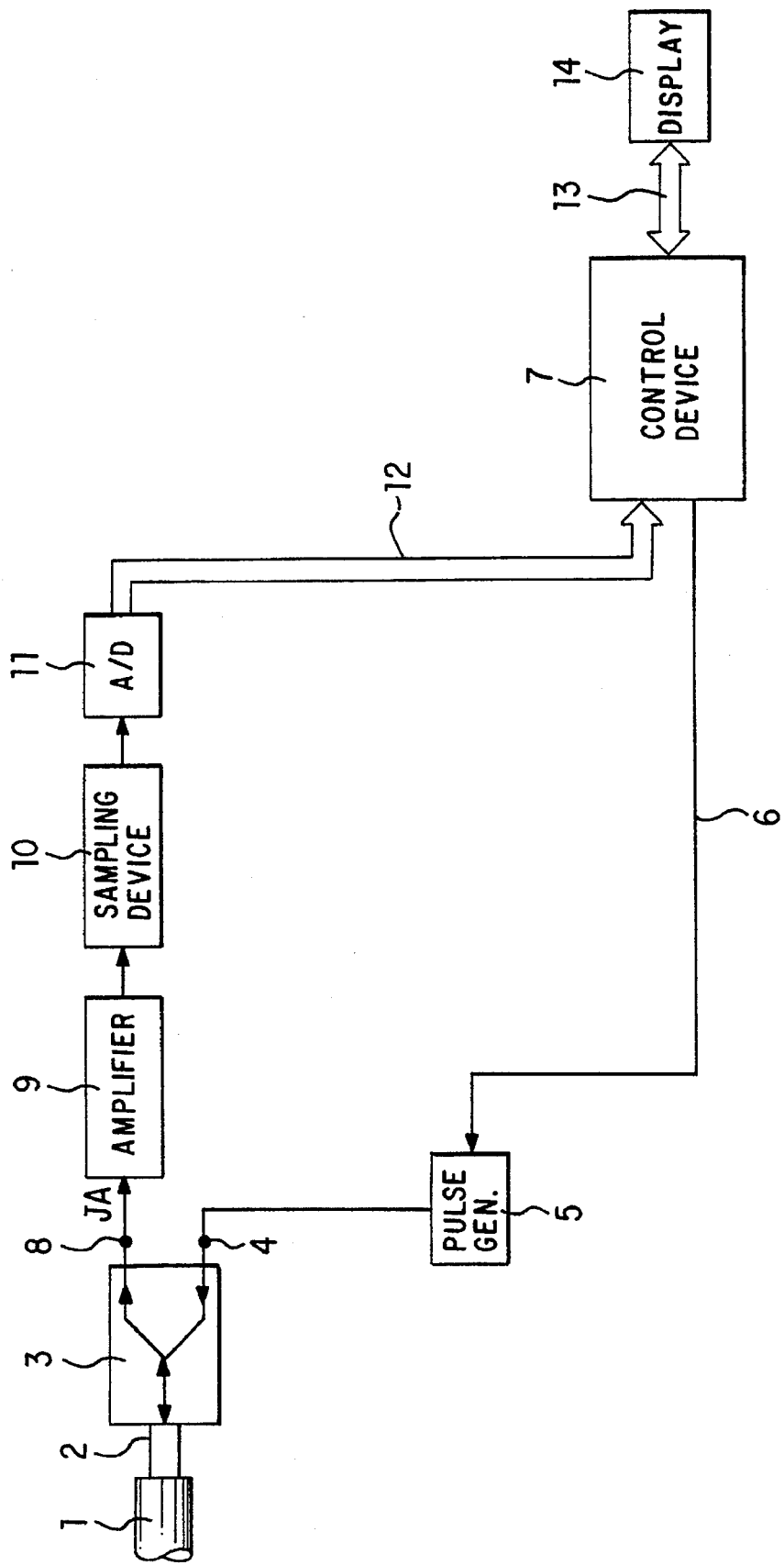
FIG. 1 depicts a block diagram of an arrangement for carrying out the method according to the invention.

The device illustrated in FIG. 1 for carrying out the method according to the invention is an arrangement by means of which a fault on a balanced line 1, as an electrical transmission line, can be detected. The balanced line 1 is connected at one end 2 via a coupler 3 to which a pulse from a pulse generator 5 is fed via an input 4, which pulse generator 5 has a trigger pulse applied to it, via a line 6, from a control device 7. The signal JA reflected by the balanced line 1 is fed via an output 8 and a downstream-connected amplifier 9 to a sampling device 10, downstream from which an analog/digital converter 11 is connected. This converter 11 is connected via a data bus 12 to the control device 7. The sample values are stored in the control device 7, preferably an electronic computer. A display device 14 is connected downstream of the control device 7, via a further data bus 13.

When the method according to the invention is carried out, the line pulse responses of a line which is of the same type as the balanced line 1 to be investigated, for example, are initially detected, using pulses reflected in such a line of the same type, as a function of the range of the assumed incorrect termination, for example a short-circuit or open end. The values of the different line pulse responses, which are thus obtained, of the line of the same type, are stored as it were as a pulse model in the control device or in the computer 7.

In order to find a fault on the balanced line 1, which must be of the same type as the line whose pulse model has been recorded, a dirac pulse is applied to the end 2. At the same time, the pulse response JA of the balanced line 1 is detected, it being possible, for example, for the pulse response to have the profile illustrated in the diagram a in FIG. 2, over the time t. The values of the pulse response are likewise stored in the control device 7, while maintaining their time relationship.

The values of the pulse response of the balanced line 1 to be investigated are subsequently investigated to determine whether they exceed a predetermined threshold W. Together with the determination of the individual values of the pulse response of the balanced line which exceed the threshold value W, their time relationship is also determined, and the correlation of the subsequent section of the pulse response according to Diagram a in FIG. 2 can be carried out with the corresponding line pulse response of the line of the same type, of which three line pulse responses J1, J2 and J3 are illustrated, by way of example, in diagram b in FIG. 2. Partial correlation coefficients r1 and r2 (see Diagram b in FIG. 2) are in each case calculated for the respective rise time of the respective line pulse response J1 to J3 and for the respective fall time.

The calculation is carried out in such a manner that a covariance sequence $Sxy_1$ is initially formed in accordance with the following equation (2) for the rise time of the line pulse response J1:

$$Sxy_1 = \frac{1}{N-1} \times \left( \Sigma X_i Y_i - \frac{1}{N} \times \Sigma X_i \Sigma Y_i \right) \quad (2)$$

Figure 2:
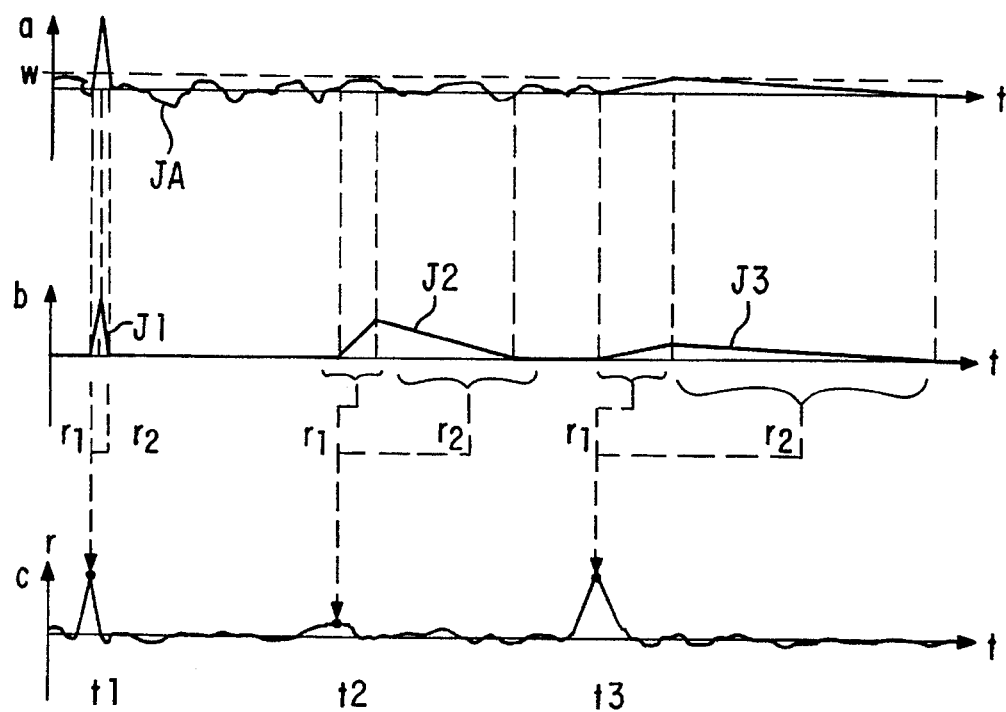
FIG. 2 depicts a schematic illustration in order to explain the correlation.

In this equation (2), N indicates the number of sample values $X_i$ of the pulse response JA in accordance with Diagram a in FIG. 2 which have occurred during the rise time of the line pulse response J1. $Y_i$ designates the sample values which have occurred during the rise time of the line pulse response J1. In this case, the parameter i varies between 1 and N.

Furthermore, the standard deviations $Sx_1$ and $Sy_1$ are determined according to the following equations (3) and (4):

$$Sx = \sqrt{\frac{\Sigma X_i^2 - \frac{(\Sigma X_i)^2}{N}}{N-1}} \quad (3)$$

$$Sy = \sqrt{\frac{\Sigma Y_i^2 - \frac{(\Sigma Y_i)^2}{N}}{N-1}} \quad (4)$$

The correlation coefficient $r_1$ for the rise time of the line pulse response J1 can then be determined, by means of the variables $Sxy_1$, $Sx_1$ and $Sy_1$, in accordance with the following relationship (5):

$$r_1 = \frac{Sxy_1}{Sx_1 \times Sy_1} \quad (5)$$

A partial correlation coefficient $r_2$ with respect to the fall time of the line pulse response J1 is calculated in a corresponding manner. The correlation coefficient $r_{J1}$ for the line pulse response J1 then results overall in accordance with the following relationship (6):

$$r_{j1}=r_1+r_2 \qquad (6)$$

Further correlation coefficients $r_{j2}$ and $r_{j3}$ with respect to the line pulse responses J2 and J3 are calculated in a corresponding manner.

Figure 3:
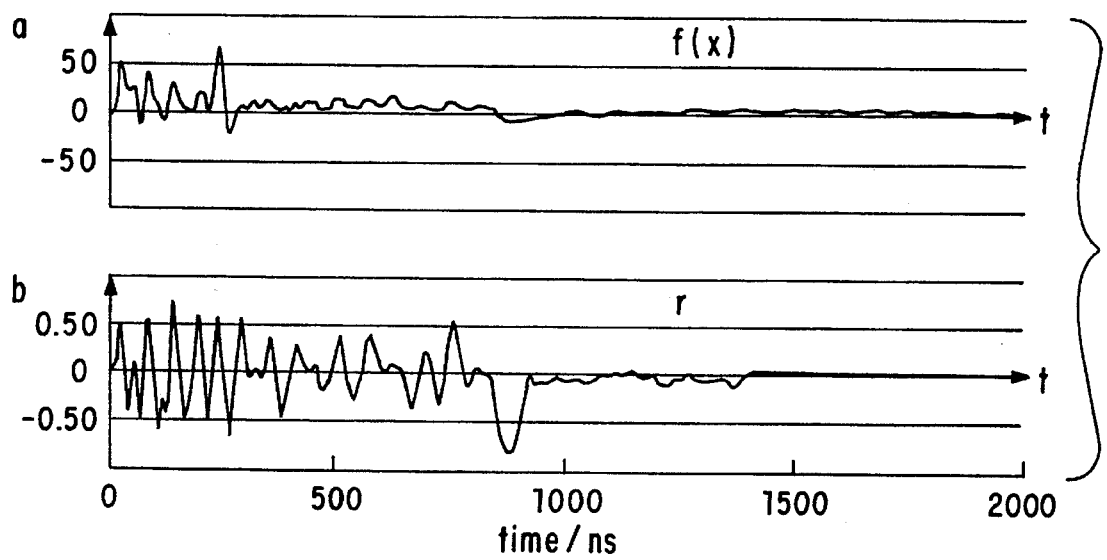
FIG. 3 depicts an illustration having two diagrams to indicate the advantages achieved in carrying out the method according to the invention.

Diagram b in FIG. 3 shows the profile of the correlation coefficients r over the time t and over the length of the line 1, it being assumed that a fault having a resistive termination of 100 Ω is present at a range of 86 m (approx. 900 ns). The diagram a in FIG. 3 shows the profile of the sample values $X_i$, as a function f(x) over the time t, for such a fault case. It should be noted that the profile of the correlation coefficient r in the diagram b—in contrast to that illustrated in FIG. 2—is found on the basis of continuous calculation using line pulse responses, which closely follow one another in time, of the line of the same type. Since the correlation coefficient r provides a measure for the similarity of the functions according to the diagrams a and b in FIG. 2, a calculation at the time $t_1$ produces a very steep pulse because the pulse response of the line 1 to be investigated, according to Diagram a, and the line pulse response J1 of the line of the same type, according to Diagram b, are very similar to one another. The correlation coefficient is correspondingly high. A flatter pulse can be expected at the time $t_2$ in Diagram c, since the form of the pulse response of the line 1 to be investigated deviates significantly from the pulse model (J2) at this point; the consequence is a low correlation coefficient. A pulse response, in accordance with Diagram a, which largely corresponds to the pulse model (J3) in accordance with Diagram b, does not occur until the time t3, which results in a high correlation coefficient.

A computation variable $Vxy_{j1}$ must additionally be used in order to determine the value of the resistance at the point of the fault on the line 1 to be investigated, which computation variable $Vxy_{j1}$ is given by the following relationship (7):

$$Vxy_{j1} = \frac{1}{N\Sigma(X_i/Y_i)} \qquad (7)$$

The computation variable $Vxy_{j1}$ with respect to the time of the peak value of the line pulse response J1 can also be calculated in accordance with the relationship (8):

$$Vxy_{j1}=X_i/Y_i \qquad (8)$$

The ratio $Vxy_{j1}$ corresponds to a weighting of the line response J1 of the line 1 of the same type, and hence to the reflection factor R(t).

The reflection factor R(t) can also be expressed in normalized form by the following relationship (9):

$$R(t) = \frac{|X_i| \times r_{j1}}{A_{max}} \qquad (9)$$

In this equation (9), Amax designates the peak value in the line pulse response J1.

The following equation (10) is used in order to calculate the value of the resistance at the point of the fault on the electrical line 1 to be investigated:

$$R_{ab}(t) = -\frac{1}{2} \times Z \times \left( \frac{1}{R(t)} + 1 \right) \qquad (10)$$

Figure 4:
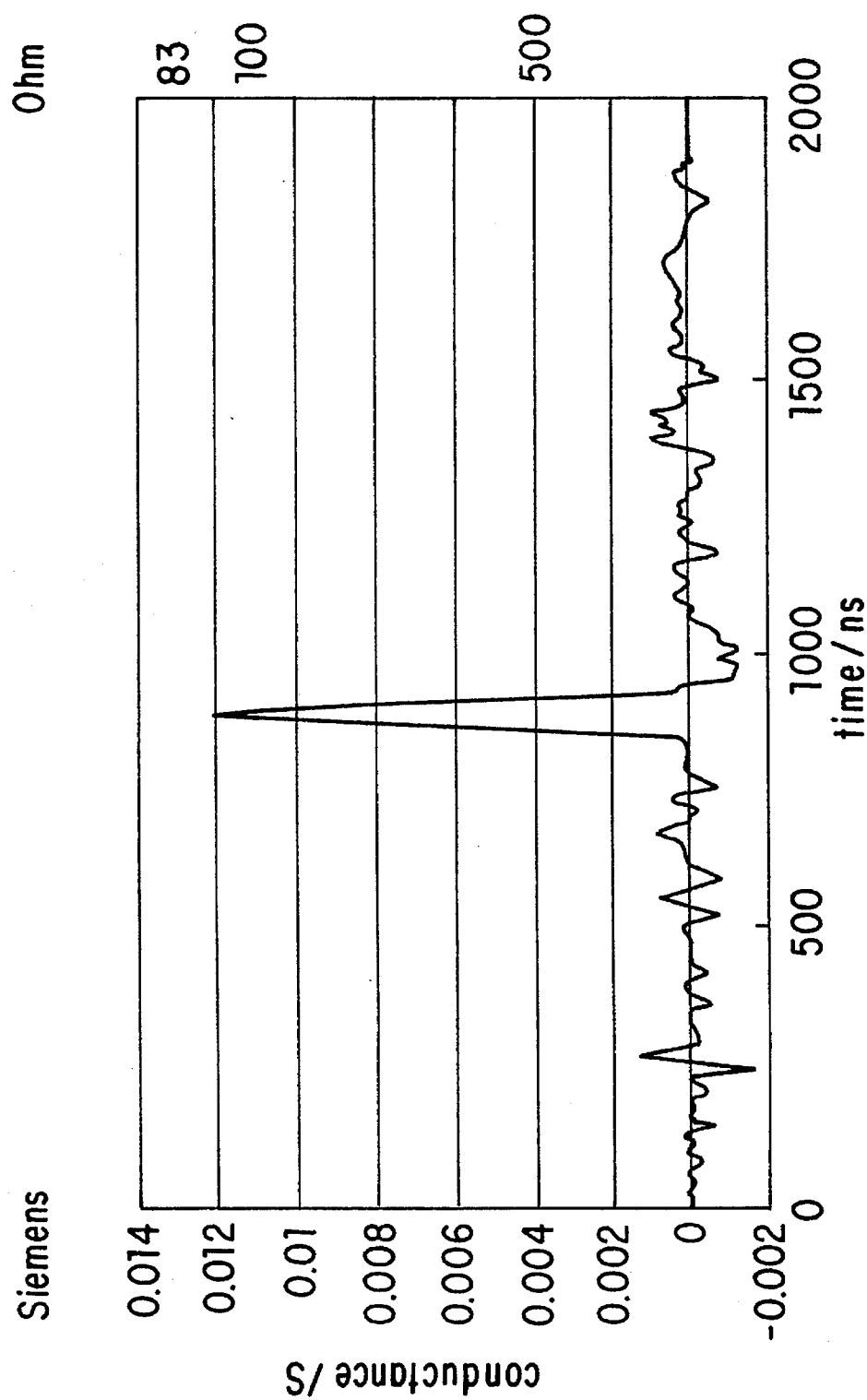
FIG. 4 depicts the profile of a determined value of the resistance of a transmission line with respect to time.

FIG. 4 shows the profile of a determined conductance in siemens (S) over time, related to the same fault case on which the consideration of FIG. 3 was based. The conductance achieves a value of approximately 10 mS, which corresponds to an incorrect termination of approximately 100 Ω.

I claim:

1. A method for finding a fault on an electrical transmission line, comprising the steps of:
    a) applying a pulse to one end of the transmission line
    b) detecting a reflected signal at said one end:
    c) determining a plurality of line pulse responses (J1, J2, J3) for different line lengths of a line of a similar type as said transmission line;
    d) storing said plurality of line pulse responses (J1, J2, J3);
    e) calculating, when a direct pulse is applied to the transmission line, the correlation coefficient ($r_1$, $r_2$, $r_3$) from sections of the detected pulse response (JA) of the transmission line as the reflected signal and from said stored line pulse responses (J1, J2, J3), which in each case correspond to the sections in time, of the line of the similar type;
    f) forming a computation variable ($Vxy_{j1}$) as a function of the quotient of a value ($X_i$) from a corresponding section of the pulse response (JA) of the transmission line and a value ($Y_i$) which corresponds in time, of the plurality of line pulse responses (J1, J2, J3) of the line of the similar type;
    g) determining from the computation variable ($V_{xy}$J1) the reflection factor (R(t)) by multiplication by the corresponding correlation coefficient ($r_{j1}$); and
    h) calculating a value (Rab(t)) of the resistance at the point of the fault using the reflecting factor (R(t)) in accordance with the relationship $$R_{ab}(t) = \frac{1}{2} \times Z \times \left( \frac{1}{R(t)} + 1 \right)$$

wherein Z designates the characteristic impedance of the telecommunications transmission line.

2. The method according to claim 1, wherein step e) of calculating further comprises calculating the correlation coefficient (rJ1, rJ2, rJ3) during a time period which corresponds to a rise time and a fall time of the line pulse response (J1, J2, J3) of the line of the similar type.

3. The method as claimed in claim 2, wherein step e) of calculating further comprises the substeps of:
    (i) performing the calculation of a partial correlation coefficient ($r_1$) during the rise time of the line pulse response;
    (ii) performing the calculation of another partial correlation coefficient ($r_2$) during the fall time of the line pulse response (J1) of the line of the similar type; and
    (iii) determining the correlation coefficient ($r_{j1}$) by multiplication of the partial correlation coefficients ($r_1$, $r_2$).

4. The method according to claim 1, further comprising the steps of:
    h) examining the pulse response (JA) of the transmission line (1) to determine if it exceeds a predetermined threshold value (W); and
    i) calculating the value ($R_{ab}(t)$) Of the resistance at the point of the fault exclusively at times when the threshold is exceeded.

5. The method according to claim 2, further comprising the steps of:
    h) examining the pulse response (JA) of the transmission line (1) to determine if it exceeds a predetermined threshold value (W); and i) calculating the value ($R_{ab}(t)$) of the resistance at the point of the fault exclusively at times when the threshold is exceeded.

6. The method according to claim 3, further comprising the steps of:

h) examining the pulse response (JA) of the transmission line (1) to determine if it exceeds a predetermined threshold value (W); and i) calculating the value ($R_{ab}(t)$) of the resistance at the point of the fault exclusively at times when the threshold is exceeded.

7. The method according to claim 1, wherein step g) of calculating the value of the resistance at the point of the fault is carded out at fixed times in pulse response (JA) of the transmission line (1).

8. The method according to claim 2, wherein step g) of calculating the value of the resistance at the point of the fault is carded out at fixed times in pulse response (JA) of the transmission line (1).

9. The method according to claim 3, wherein step g) of calculating the value of the resistance at the point of the fault is carried out at fixed times in pulse response (JA) of the transmission line (1).

* * * * *